United States Patent [19]

Matsui et al.

[11] Patent Number: 4,605,566

[45] Date of Patent: Aug. 12, 1986

[54] METHOD FOR FORMING THIN FILMS BY ABSORPTION

[75] Inventors: Shinji Matsui; Susumu Asada; Katsumi Mori, all of Tokyo, Japan

[73] Assignee: NEC Corporation, Tokyo, Japan

[21] Appl. No.: 643,194

[22] Filed: Aug. 22, 1984

[30] Foreign Application Priority Data

Aug. 22, 1983 [JP] Japan ................... 58-152713
Aug. 31, 1983 [JP] Japan ................... 58-159814

[51] Int. Cl.⁴ .............................. B05D 3/06
[52] U.S. Cl. ................... 427/43.1; 427/84; 427/85; 427/91; 427/99; 427/255.1; 427/255.2; 427/255
[58] Field of Search ............. 427/43.1, 85, 99, 84, 427/91, 255, 255.1, 255.2

[56] References Cited

U.S. PATENT DOCUMENTS

| | | | |
|---|---|---|---|
| 3,205,087 | 9/1965 | Allen .......................... | 427/43.1 X |
| 3,294,583 | 12/1966 | Fedows-Fedotowsky ........ | 427/43.1 |
| 3,664,866 | 5/1972 | Manasevit .................... | 427/255.2 X |
| 4,042,006 | 8/1977 | Engl et al. ................... | 427/43.1 X |
| 4,309,241 | 1/1982 | Garavaglia et al. ........... | 427/255.2 X |
| 4,436,769 | 3/1984 | Moss et al. .................. | 427/255.2 X |

*Primary Examiner*—Thurman K. Page
*Attorney, Agent, or Firm*—Burns, Doane, Swecker and Mathis

[57] ABSTRACT

A film of an element is deposited on a semiconductor substrate by passing on the substrate gas containing the element and then irradiating a predetermined portion of the substrate with an electron beam. Then, the gas is decomposed to deposit the element on the substrate so as to form a pattern. By heating the pattern, the element is diffused into the surface of the substrate thus forming a diffused region. The gas is generated by sublimating solid $Cr(C_6H_6)_2$, $Mo(C_6H_6)_2$, $Mo(C_6H_6)_2$, $Al(CH_3)_3$, $WCl_6$ etc.

9 Claims, 15 Drawing Figures

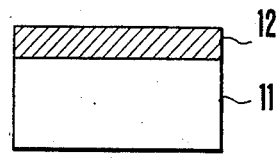
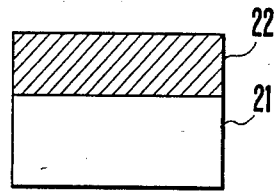
FIG.1A  FIG.2A
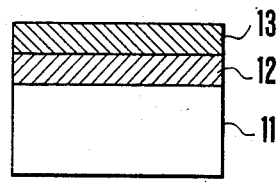
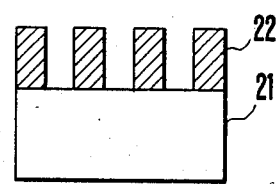
FIG.1B  FIG.2B
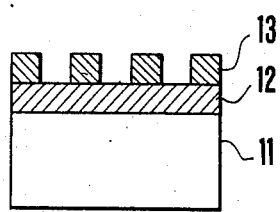
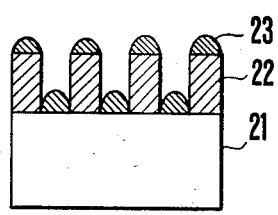
FIG.1C  FIG.2C
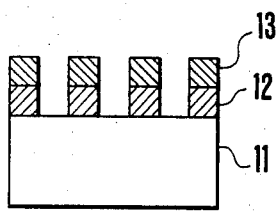
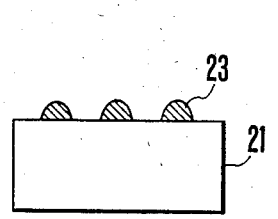
FIG.1D  FIG.2D
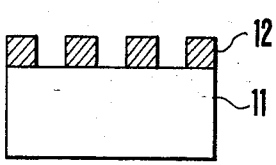
FIG.1E

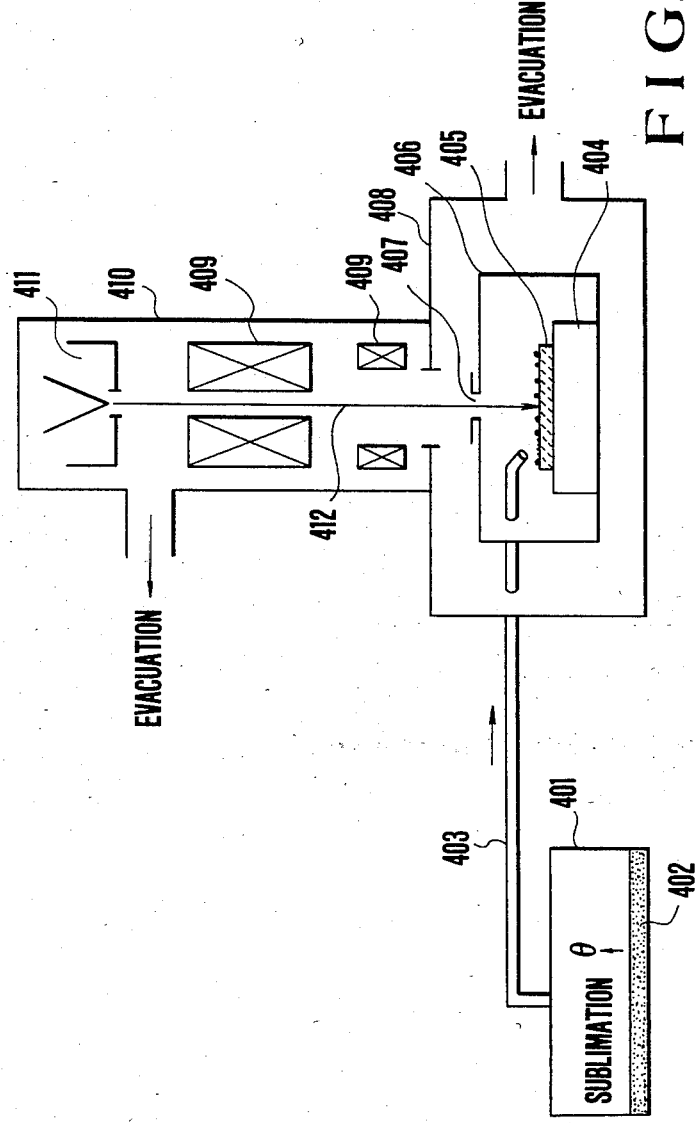

METHOD FOR FORMING THIN FILMS BY ABSORPTION

BACKGROUND OF THE INVENTION

This invention relates to a method and apparatus for forming a thin film on a substrate by using an electron beam.

In the past, to form a pattern on a semiconductor substrate, methods shown in FIGS. 1A through 1E and FIGS. 2A through 2D have been used. According to a method shown in FIGS. 1A to 1E, material 12 utilized to form a pattern is deposited on a semiconductor substrate 11 by vapor deposition or sputtering process (FIG. 1A). Then, as shown in FIG. 1B, a layer of a photoresist 13 is formed and exposed to light or an electron beam to be patterned as shown in FIG. 1C. Then, the film of the material 12 is etched by chemical etching or dry etching process by using the resist pattern 13 as a mask, as shown in FIG. 1D. Finally, the resist pattern 13 is removed to form a patterned film as shown in FIG. 1E.

FIGS. 2A through 2D show another method in the prior art using lift-off process. More particularly, a film of a resist 22 is first coated on a semiconductor substrate 21 as shown in FIG. 2A. Then, the resist film 22 is patterned as shown in FIG. 2B by exposing it to light or an electron beam. Then, a pattern material 23 is vapor deposited on the patterned resist film 22 and the substrate 21 as shown in FIG. 2C. After that, the patterned resist 22 is removed to leave pattern material 23 on the substrate 21 as shown in FIG. 2D.

The prior art methods are disadvantageous in that;
(1) the formation process is prolonged, and
(2) the formation of a sufficiently fine pattern is impossible.

Among various semiconductor devices, a gallium arsenide (GaAs) device is expected to be highly integrated because of its high operation speed and high output.

To integrate GaAs elements, it is necessary to isolate elements from each other. Such element isolation has been made as follows. FIG. 6 is a cross-sectional view showing one example of the prior art device. As shown, an electroconductive N-type GaAs layer 220 is formed on the surface of a semi-insulator GaAs substrate 210 and then etched to form GaAs layer cell isolating regions 230 are formed. A source electrode 250, a gate electrode 260 and a drain electrode 270 are formed in each cell region 240. In this case, the inter-cell isolation is made by utilizing the fact that the resistance of the substrate is high. Although the resistivity of the substrate is made high by doping chromium in the GaAs substrate, there is a problem that the concentration of chromium in the surface of the substrate is decreased by the heat treatment at the time of forming the cells, thus decreasing inter-cell isolation resistance.

Although in the construction shown in FIG. 6, the cell isolation regions 230 and the cell regions 240 are at different levels, such level difference can be eliminated with ion implantation method. FIG. 7 is a sectional view showing a prior art device prepared by the ion implantation method. Ions are implanted into cell regions 240 to form N-type regions 360. After forming gate patterns 260, ions are further implanted to form N-type region 350 and 370. Isolating regions 230 between cell regions 240 are not implanted with ions. In the case of the ion implantation method too, heat treatment causes the resistance of the substrate at the cell isolating region to decrease. For this reason, it has been impossible to make the cell isolation regions small, making it difficult to integrate cells at high desities. Where insulative ions such as chromium are doped into the cell isolation region, for the purpose of preventing decrease in the cell isolation resistance, such insulative ions may be further added to compensate the degrees in the cell isolation resistance. To implant such insulative ions, a mask has been used. But this method disadvantageously requires preparation and use of a mask.

SUMMARY OF THE INVENTION

It is an object of this invention to provide a method and apparatus for forming a highly accurate and highly purified thin film or film pattern with an electron beam with high accuracy without using a mask, for example, a resist mask.

Another object of this invention is to provide a novel method and apparatus for doping P or N-type dopant into the surface of a semiconductor substrate according to a predetermined pattern by using an electron beam and without using a mask.

A still another object of this invention is to provide a method and apparatus for forming a cell isolating pattern on a semiconductor wafer without using a mask, the method and apparatus obviating the problem of cell isolation of a GaAs integrated circuit, thus enabling to integrate GaAs cells at a higher density.

According to one aspect of this invention, there is provided a method for forming a film on a substrate comprising the steps of passing on the substrate gas containing an element to be deposited on the substrate, and irradiating an electron beam upon a predetermined portion of the substrate to deposit the element on the portion, thereby forming a film.

Where the substrate is made of a semiconductor material, after depositing the element, the substrate is heat treated to diffuse the deposited element into the semiconductor materials.

According to another aspect of this invention, there is provided apparatus for forming a film on a semiconductor substrate comprising an electron beam irradiating system contained in an evacuated chamber, an evacuated sample chamber communicated with the evacuated chamber, means for supporting the semiconductor substrate in the sample chamber to be irradiated by an electron beam generated by the electron beam irradiating system and means for supplying gas containing an element to be deposited on the surface of the substrate.

The deposited film is used to form a pattern or diffused into the surface of the substrate.

BRIEF DESCRIPTION OF THE DRAWINGS

Other objects, features and advantages of the present invention will become apparent from the following detailed description thereof taken in a conjunction with the accompanying drawing, in which:

FIGS. 1A to 1E and FIGS. 2A to 2D show successive steps of forming patterns on semiconductor substrates according to prior art methods;

FIG. 4 is a sectional view showing the apparatus utilized in the method shown in FIG. 3;

DESCRIPTION OF THE PREFERRED EMBODIMENTS

Figure 3:
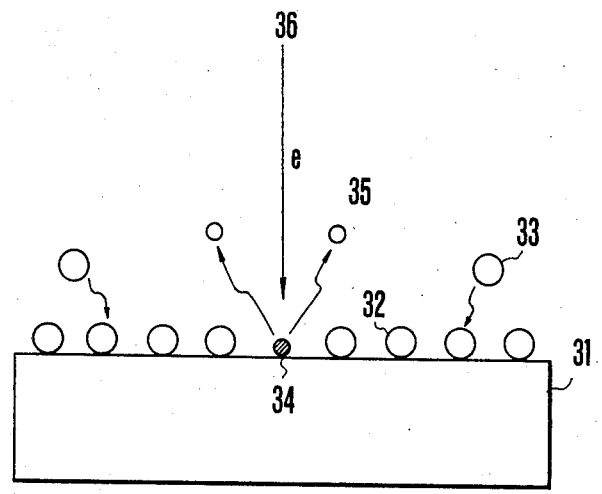
FIG. 3 is a diagrammatic representation showing the method and according to one embodiment of this invention.

The principle and operation of one embodiment of this invention will be described with reference to FIG. 3. When a semiconductor substrate 31 is disposed in an atmosphere containing gas molecules 33 to be deposited, the gas molecules 33 are adsorbed by the substrate 31. Reference numerals 32 represents adsorbed gas molecules. Then, when the substrate 31 is irradiated with an electron beam 36, the adsorbed molecules 32 irradiated with the electron beam 36 are decomposed into elements 34 of the material to be deposited and molecules 35 of volatile material so that the elements 34 precipitate on the surface of the substrate. On the other hand, the molecules 35 of the volatile material are discharged to the outside. According to the principle described above, when the surface of the substrate 31 is irradiated with an electron beam, the material to be deposited contained in the gaseous atmosphere precipitates directly on the substrate to form a desired pattern.

FIG. 4 shows apparatus utilized to carry out one embodiment of the method of this invention. The apparatus comprises an electron beam irradiating system 410, a sample chamber 408, an auxiliary sample chamber 406 and a chamber 401 for containing atmosphere gaseous material. In this embodiment, bisbenzene chromium $Cr(C_6H_6)_2$ containing chromium Cr as the deposition element is utilized as the atmosphere gas, and chromium is deposited by irradiating a focused electron beam. Denoted by 402 is $Cr(C_6H_6)_2$ contained in the chamber 401, and a silicon substrate 405 is mounted on a sample pedestal 404. Then, the electron beam irradiating system 401 and the sample chamber 408 are evacuated to high vacuum higher than about $10^{-5}$ Torr. A pin hole 407 is formed in the auxiliary sample chamber 406 for the purpose of maintaining a desired pressure difference between the inside and outside of the auxiliary sample chamber 406, and for establishing a path for the electron beam 412 adapted to irradiate the substrate. The auxiliary sample chamber 406 and the chamber 401 for containing the atmosphere gaseous material are interconnected by a conduit 403, so that when the sample chamber 408 is evacuated, the chamber 401 and the auxiliary sample chamber 406 are also evacuated through pin hole 407. $Cr(C_6H_6)_2$ is solid in the atmosphere but when the chamber 401 is evacuated, it readily sublimates so that the auxiliary sample chamber 406 would be filled with the gas of $Cr(C_6H_6)_2$ via conduit 403. The pressure of the gas is about 5 mili-Torr. Thus, the silicon substrate 405 is surrounded by the gas of $Cr(C_6H_6)_2$. As a consequence, when the electron beam 412 is irradiated upon a desired portion of the silicon substrate 405 through pin hole 407, the $Cr(C_6H_6)_2$ adsorbed on the surface of the substrate 405 would be decomposed into chromium and benzene $C_6H_6$. The Cr precipitates on the surface of the substrate, while evaporated $C_6H_6$ is discharged to the outside of the apparatus.

Figure 5:
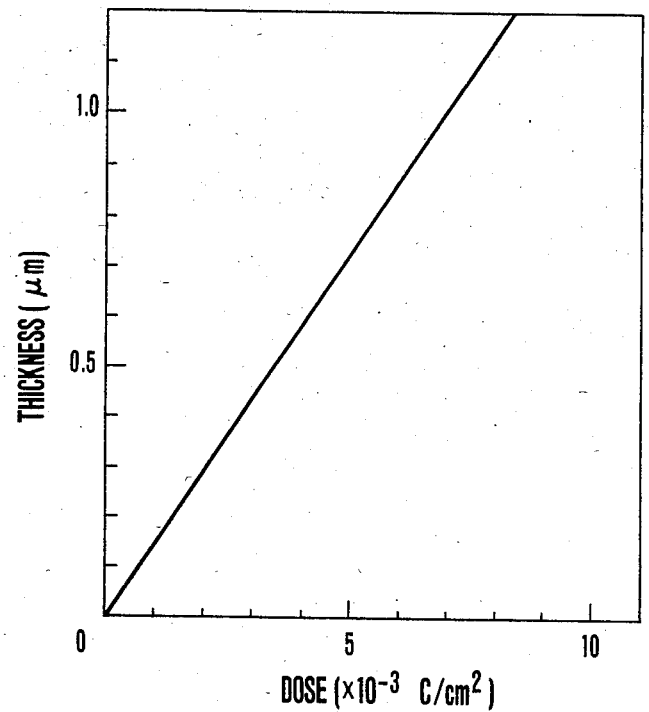
FIG. 5 is a graph showing the relation between irradiation dose and the deposited thickness.
Figure 6:
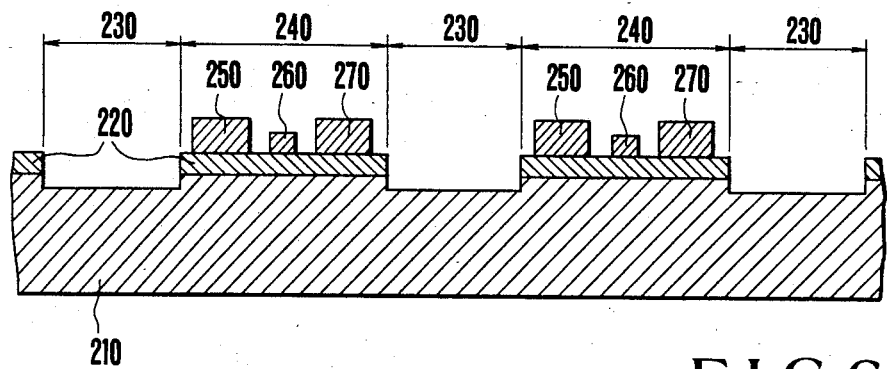
FIGS. 6 and 7 are sectional views showing GaAs device prepared by using prior art cell isolating method.
Figure 7:
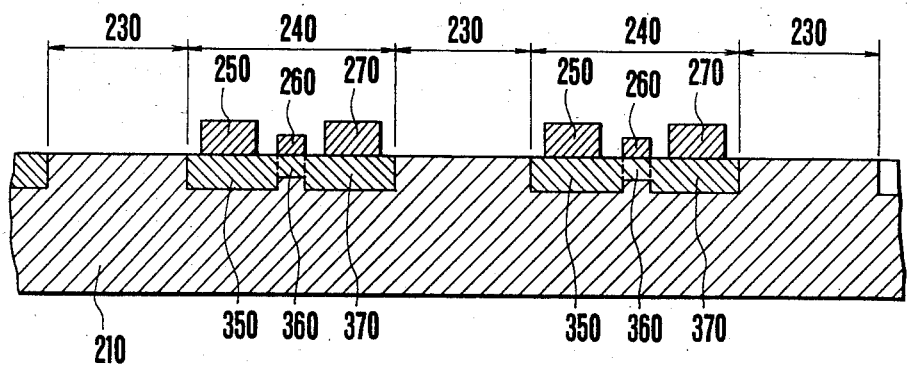

FIG. 5 shows the relation between the irradiation dose of the electron beam and the thickness of the deposited chromium. As can be noted from FIG. 5, as the irradiation dose increases, the thickness of the deposited chromium increases. According to this embodiment, a chromium pattern having a width of 0.1 micron can be formed.

Even when there is a stepped portion on the surface of the substrate, a chromium film can be formed on the stepped portion with a thickness substantially the same as that on a flat portion. According to this invention, a beam control similar to election beam exposure can be made so that deposition can be made with sufficient control of the line width and film thickness. Since the pattern line width depends upon the diameter of the electron beam, and since the deposited thickness depends upon the irradiation dose, the line width and the deposited thickness can be independently set, whereby a very fine pattern having a high aspect ratio can be formed.

Although in this embodiment as the material to be deposited was used gaseous $Cr(C_6H_6)_2$ containing chromium, such organic metal compounds as $Mo(C_6H_6)_2$ and $Al(CH_3)_3$ can also be used. When $Mo(C_6H_6)_2$ is used, molybdenum is deposited, whereas when $Al(CH_3)_2$ is used, aluminum is deposited.

Further, when $WCl_6$, $WCl_5$, $WBr_5$ are used as the gaseous material, tungsten can be deposited. In the same manner, molybdenum can be deposited by using $MoCl_5$, $MoBr_5$, etc. Also, tantalum, can be deposited by using $TaCl_5$, $TaBr_5$, etc, titanium can be deposited by using $T_iI_4$, etc., and zirconium can be deposited by using $ZrI_4$, etc. The materials Al, Mo, W, Ti etc. described above can be used for wirings and gate electrodes of intergrated circuit and LSI.

The film material that can be deposited according to this invention is not limited to metal. For example, a silicon film can be deposited when gaseous $SiH_4$ or $SiCl_4$ is used as the geseous material. Boron can be deposited by using $BCl_3$ or $BBr_3$, and phosphor can be deposited by using $POCl_3$. In addition, boron or phosphor can be doped into a semiconductor substrate. Furthermore, a silicon film doped with boron or phosphor can be formed on the substrate by adjusting the ratio of flow rates and presssure of the gaseous materials. As described above, since it is possible to deposite or dope boron or phosphor, it is possible to form a pn junction on the surface of a semiconductor substrate such as of Si or GaAs. TiN can be deposited by irradiating an electron beam while causing a gaseous mixture of $TiCl_4$ and $N_2$ to flow on the surface of a substrate. TiN can also be formed with a mixture of $TiI_4$ and $N_2$, or $Ti\ N(C_2H_5)_2$. Where $Si(OC_2H_5)_4$ is used, $SiO_2$ can be formed and where $Ta(OC_2H_5)_5$ is used, $Ta_2O_5$ can be formed. When $BCl_3$, $BBr_3$ and a metal forming material described above are used concurrently, a boride film can be formed.

In the method of depositing a metal film described above, when such carrier gas as argon is passed together with gaseous material gas, the deposition speed can be controlled. Where the gaseous material is formed by sublimation of solid or evaporation of liquid, the deposition speed can be increased by heating the solid or liquid.

As described above, according to this invention, by irradiating with an electron beam the surface of a semiconductor substrate maintained in a gaseous atmosphere containing metal to be deposited, the metal can be deposited on or doped in the surface of the substrate so that the method of this invention can simplify its steps as compared to the prior art method.

Instead of a focused electron beam, a divergent electron beam can also be used.

Although in the foregoing embodiment the method of this invention was described to form a fine film pattern or a thin film, the method of this invention may be considered as a method of directly depositing a highly purified film on a semiconductor substrate from gaseous material. In other words, according to the method of this invention, a high purity film can be deposited even from gaseous material of lesser purity. Thus, the refinement of the gaseous material and the deposition of the film proceed at the same time.

In a modified method of this invention, at the time of forming a GaAs high resistance pattern in a GaAs substrate, the principle and operation of the electron beam deposition is the same as those described in connection with FIG. 3 and the apparatus utilized to carry out the modified method is identical to that shown in FIG. 4.

Figure 8:
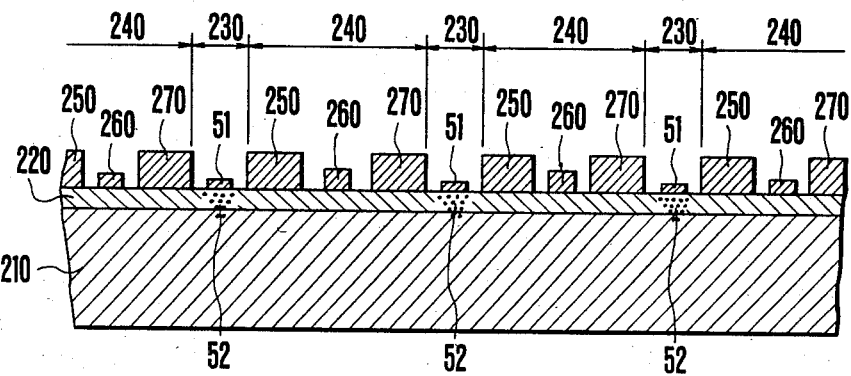
FIG. 8 is a sectional view showing a GaAs device prepared by the method of this invention.

FIG. 8 shows the cross-section of a GaAs device whose cells are isolated by using the electron beam deposition apparatus shown in FIG. 4. As usual, an N-type GaAs layer having a thickness of about 0.1 micron is epitaxially grown on insulative GaAs substrate 210. Then, gaseous $Cr(C_6H_6)_2$ is passed and an electron beam is irradiated to form a chromium pattern 51 having a width of 0.5 micron and a thickness of 0.05 micron. After stopping the flow of $Cr(C_6H_6)_2$ gas, the chromium pattern 51 is annealed at a temperature of about 400°–500° C. under the bombardment of electron beam to form a chromium diffused pattern 52 having a width of about 1 micron. The diffused pattern reaches the substrate 210. With this method, since a high resistance cell isolating pattern can be formed readily and since the width of the isolating pattern can be made extremely small, integration of the cells at a high density becomes possible.

Like the first embodiment, $Mo(C_6H_6)_2$ and $B_2H_6$, etc can also be used as the gaseous material.

As described above, this modification can form a high resistance pattern utilized to isolate GaAs cells more readily and finely than the prior art method whereby GaAs cells can be integrated at a high density.

What is claimed is:

1. A method of forming a film on a substrate, comprising the steps of:
   placing the substrate in an atmosphere of gas containing molecules of a material that, upon decomposition, yield an element for forming a film on the substrate;
   allowing said molecules to be absorbed by the substrate; and
   decomposing said molecules into said element and a volatile material at patternwise locations on said substrate by irradiating said patternwise locations with an electron beam;
   whereby said element forms a film on said predetermined portions of said substrate and said volatile material is discharged from said substrate.

2. The method according to claim 1 wherein said element is diffused into said substrate.

3. The method according to claim 1 wherein said gas is selected from the group of gases consisting of $Cr(C_6H_6)_2$, $Mo(C_6H_6)_2$, $Al(CH_3)_3$, $WCl_6$, $WCl_5$, $WBr_5$, $MoCl_5$, $MoBr_5$, $TaCl_5$, $TaBr_5$, $TiI_4$, $ZrI_4$, $BCl_3$, $BBr_3$ $POCl_3$, $TiCl_4$. $Si(OC_2H_5)_4$, $Ta(OC_2H_5)_6$, $SiH_4$ and $SiCl_4$.

4. The method according to claim 1, wherein said gas comprises a mixture of $N_2$ and $TiCl_4$ or $TiI_4$ so that TiN is deposited on said substrate.

5. The method according to claim 1 wherein said gas comprises $Si(OC_2H_5)_4$ so that $SiO_2$ is deposited on said substrate.

6. The method according to claim 1 wherein said gas comprises $Ta(OC_2H_5)_6$ so that $Ta_2O_5$ is deposited on said substrate.

7. The method according to claim 1 wherein said gas is admixed with carrier gas.

8. The method according to claim 1 wherein said substrate is a semiconductor body, and said method further comprises a step of heat treating said substrate deposited with said element so as to diffuse said deposited element into said semiconductor body.

9. The method according to claim 8 wherein said gas is selected from the group of gases consisting of $Cr(C_6H_6)_2$, $Mo(C_6H_6)_2$, $Al(CH_3)_3$, $WCl_6$, $WCl_5$, $WBr_5$, $MoCl_5$, $MoBr_5$, $TaCl_5$, $TaBr_5$, $TiI_4$, $ZrI_4$, $BCl_3$, $BBr_3$ and $POCl_3$.

* * * * *